United States Patent
Moriguchi et al.

(10) Patent No.: US 10,457,885 B2
(45) Date of Patent: *Oct. 29, 2019

(54) COATING FILM, MANUFACTURING METHOD FOR SAME, AND PVD DEVICE

(71) Applicants: NIPPON ITF, INC., Kyoto (JP); NIPPON PISTON RING CO., LTD., Saitama (JP)

(72) Inventors: Hideki Moriguchi, Kyoto (JP); Tadashi Saito, Tochigi (JP); Yoshikazu Tanaka, Kyoto (JP); Akinori Shibata, Kyoto (JP); Tetsumi Arahi, Kyoto (JP); Katsuaki Ogawa, Saitama (JP); Takahiro Okazaki, Saitama (JP); Hiroyuki Sugiura, Saitama (JP); Yoshihiro Ito, Saitama (JP)

(73) Assignees: NIPPON ITF, INC., Kyoto (JP); NIPPON PISTON RING CO., LTD., Saitama (JP)

(*) Notice: Subject to any disclaimer, the term of this patent is extended or adjusted under 35 U.S.C. 154(b) by 277 days.

This patent is subject to a terminal disclaimer.

(21) Appl. No.: 15/511,638

(22) PCT Filed: Sep. 17, 2014

(86) PCT No.: PCT/JP2014/074598
§ 371 (c)(1),
(2) Date: Mar. 16, 2017

(87) PCT Pub. No.: WO2016/042629
PCT Pub. Date: Mar. 24, 2016

(65) Prior Publication Data
US 2017/0306257 A1 Oct. 26, 2017

(51) Int. Cl.
*C10M 103/02* (2006.01)
*C23C 14/06* (2006.01)
(Continued)

(52) U.S. Cl.
CPC .......... *C10M 103/02* (2013.01); *C01B 32/05* (2017.08); *C23C 14/06* (2013.01);
(Continued)

(58) Field of Classification Search
CPC .............. C23C 14/325; C23C 14/0605; C01P 2004/04; C01P 2002/82; C10M 2201/0413; C10N 2230/20
See application file for complete search history.

(56) References Cited

U.S. PATENT DOCUMENTS 7,883,775 B2 * 2/2011 Kazahaya ............... B23G 5/06
428/408
8,298,999 B2 10/2012 Honda et al.
(Continued)

FOREIGN PATENT DOCUMENTS

| CN | 1922338 | 2/2007 |
| CN | 101016624 | 8/2007 |

(Continued)

OTHER PUBLICATIONS

"International Search Report (Form PCT/ISA/210) of PCT/JP2014/074598", dated Dec. 16, 2014, with English translation thereof, pp. 1-4.
(Continued)

*Primary Examiner* — Vishal V Vasisth
(74) *Attorney, Agent, or Firm* — JCIPRNET

(57) ABSTRACT

Provided are a coating film, a manufacturing method for the same, and a PVD device that not only sufficiently improve the balance of low-friction properties and wear resistance, but also improve chipping resistance and peeling resistance. This film is coated on a substrate surface, wherein the coating film has a hard carbon that presents relatively black and white when observed in a cross-sectional bright-field TEM image, a mesh-shaped hard carbon layer is formed
(Continued)

using a PVD method, said layer having white-colored hard carbon in a mesh shape extending in the thickness direction and black-colored hard carbon dispersed into the cavities in the mesh, and the ID/IG ratio is 1-6 when the mesh-shaped hard carbon layer is measured using Raman spectroscopy, said ratio being the ratio of the Raman spectrum D band peak area intensity and G band peak area intensity.

17 Claims, 5 Drawing Sheets

(51) Int. Cl.
*C01B 32/05* (2017.01)
*C23C 14/32* (2006.01)

(52) U.S. Cl.
CPC ........ *C23C 14/0605* (2013.01); *C23C 14/325* (2013.01); *C01P 2002/82* (2013.01); *C01P 2004/04* (2013.01); *C10M 2201/0413* (2013.01); *C10N 2230/20* (2013.01)

(56) References Cited

U.S. PATENT DOCUMENTS

| | | | |
|---|---|---|---|
| 2002/0114756 A1 | 8/2002 | Gruen et al. | |
| 2007/0054125 A1* | 3/2007 | Akari | C23C 14/024 428/408 |
| 2007/0074664 A1 | 4/2007 | Nishimura et al. | |
| 2007/0251815 A1 | 11/2007 | Lo et al. | |

FOREIGN PATENT DOCUMENTS

| | | |
|---|---|---|
| EP | 1992715 | 9/2013 |
| JP | H1087396 | 4/1998 |
| JP | 2001261318 | 9/2001 |
| JP | 2002146533 | 5/2002 |
| JP | 2002327271 | 11/2002 |
| JP | 2007119908 | 5/2007 |
| JP | 2007297698 | 11/2007 |
| JP | 2009184859 | 8/2009 |
| JP | 2010229552 | 10/2010 |
| JP | 2011001598 | 1/2011 |
| JP | 2011148686 | 8/2011 |
| JP | 2011225995 | 11/2011 |
| JP | 2013528697 | 7/2013 |
| JP | 2013234353 | 11/2013 |
| WO | 2005083144 | 9/2005 |

OTHER PUBLICATIONS

"Office Action of China Counterpart Application," with English translation thereof, dated Oct. 10, 2018, p. 1-p. 25.
"Office Action of Japan Counterpart Application," with machine English translation thereof, dated Apr. 11, 2017, p. 1-p. 6, in which the listed reference was cited.
"Office Action of Japan Counterpart Application," with machine English translation thereof, dated Aug. 7, 2017, p. 1-p. 6, in which the listed references were cited.
"Search Report of European Counterpart Application," dated Mar. 15, 2018, p. 1-p. 7.
Office Action of China Counterpart Application, with English translation thereof, dated May 13, 2019, pp. 1-24.
"Office Action of Japan Counterpart Application", dated Jan. 7, 2019, with English translation thereof, p. 1-p. 7.
"Office Action of India Counterpart Application", dated Jan. 11, 2019, with English translation thereof, p. 1-p. 7.

* cited by examiner

COATING FILM, MANUFACTURING METHOD FOR SAME, AND PVD DEVICE

CROSS-REFERENCE TO RELATED APPLICATION

This application is a 371 application of the international PCT application serial no. PCT/JP2014/074598, filed on Sep. 17, 2014. The entirety of each of the abovementioned patent applications is hereby incorporated by reference herein and made a part of this specification.

BACKGROUND OF THE INVENTION

1. Field of the Invention

The present invention relates to a coating film, a manufacturing method for the same, and a Physical Vapor Deposition (PVD) device, in particular, to a suitable coating film serving as coating films of various sliding members, a manufacturing method for the same, and a PVD device used in the manufacturing method.

2. Description of Related Art

In recent years, in various industrial fields, especially in the field of automobile, the study of coating surfaces of members requiring slidability such as engine substrates or other mechanical substrates with a hard carbon film is prevalent.

The hard carbon film is generally called with various names such as Diamond Like Carbon (DLC) film, amorphous carbon film, i-carbon film, and diamond-like carbon film, which is not structurally crystalline and is classified as amorphous.

Moreover, regarding the hard carbon film, it is generally considered that single bonds (C—C) as seen in diamond crystals and double bonds (C=C) as seen in graphite crystals are coexisted, in addition to having high hardness, high wear resistance, excellent chemical stability and other characteristics like the diamond crystals, also has low hardness, high lubricity, excellent object adaptability and other characteristics like the graphite crystals. In addition, as it is amorphous, it has excellent flatness and also has low friction when in direct contact with an object material, that is, small friction coefficient or excellent object adaptability.

The characteristics vary significantly depending on a film-forming condition, a sliding condition, and an object material, and a technology that improves those characteristics by controlling the composition, the structure, and surface roughness of the hard carbon film has been put forward.

On the other hand, low-friction properties and wear resistance which are important characteristics for the sliding member are in a trade-off relation, and thus it is difficult to balance these characteristics.

Therefore, the balance of low-friction properties and wear resistance of the coating film is sought to a certain extent by specifying a hard carbon layer upon low hardness, or specifying a coexisted existence state of low-hardness hard carbon and high-hardness hard carbon, or effectively utilizing low-hardness hard carbon, thereby improving the trade-off relation.

However, the present situation is still insufficient to have the low-friction properties and the wear resistance both ways. Also, for the coating film of the sliding member, in addition to the low-friction properties or wear resistance, chipping resistance (defect resistance) or peeling resistance is further required, but the present situation is that improvement of the characteristics is still insufficient.

For example, Patent Document 1 shows that, by alternately stacking a low-hardness hard carbon layer and a high-hardness hard carbon layer, low-friction properties and wear resistance are balanced, but the balance is still insufficient, chipping resistance or peeling resistance is insufficient, the low-hardness hard carbon layer is an amorphous structure that uses carbon as a main component, and contains a graphite cluster formed by a mean diameter of 2 nm, while the high-hardness-hard carbon layer contains a graphite cluster formed by a mean diameter of below 1 nm.

Besides, Patent Document 2 discloses a hard carbon film formed using a plasma Chemical Vapor Deposition (CVD) method that uses carbon and hydrogen as main components and has a surface roughness of Rmax below 0.5 μm, which is an amorphous structure in X-ray diffraction crystallography. As a mixture of clusters of a diamond structure and a graphite structure, low-friction properties and wear resistance are balanced by specifying the number of carbon atoms of each cluster; however, to prevent abnormal growth from reducing surface roughness, two clusters of a diamond structure and a graphite structure are required, the number of atoms of each cluster is substantially 100-2000, and thus, even if it is an amorphous structure in X-ray diffraction, it sometimes also contains crystalline substances if tiny areas are analysed with electron beam diffraction, the cluster is big in size and is limited in the balance of low-friction properties and wear resistance, and chipping resistance or peeling resistance is insufficient.

Besides, Patent Document 3 discloses a metal member formed by at least configuring a DLC film on an iron-containing metal substrate, and the DLC film, in Raman spectroscopy, has a peak derived from graphite which is observed in a range of a wave number of 1550-1600 $cm^{-1}$. There are multiple different intensities of the peak mixed in a film surface, a difference between the maximum and minimum peak intensities is more than one bit, and it is shown that, by locally making a high-hardness DLC film and an excellent-lubricity DLC film separately within the same film surface, a film that combines DLC films with different hardness is made in the same surface, to balance low-friction properties and wear resistance, but the sizes of the excellent-hardness DLC film and the excellent-lubricity DLC film in the surface are up to dozens of microns (μm), and thus poor performance caused by parts is easy to occur, and it is difficult to balance low-friction properties and wear resistance uniformly in a sliding surface.

In addition, Patent Document 4 discloses a hard carbon film having a structure that at least one part of $sp^2$ bonding crystals are successively connected in a film thickness direction; however, in order to make the hard carbon film contain crystalline substances, the energy of carbon ions reaching the substrate has to be increased, and the bias voltage during film-forming is reduced to −400 V to −1000 V. However, under such a film-forming condition, the film formed has low hardness and poor wear resistance. Therefore, even if it is suitable for to serve as a conductive member, it cannot be used as a coating film of a sliding member requiring excellent wear resistance.

In addition, Patent Document 5 discloses a nitrogen-containing alignment DLC film in which the amount of carbon having an $sp^2$ hybridized orbital is above 70 atom % and a graphite (002) surface is aligned along a thickness direction, but during film-forming, nitrogen is used in plasma CVD, and the bias voltage is very low to be below −1500 V. Therefore, carbon electrons having an $sp^2$ hybridized orbital is above 70% and the $sp^2/sp^3$ ratio becomes very great to be 2.3-∞, only a coating film with low hardness and poor wear resistance can be obtained, but it still cannot be used as a coating film of the sliding member.

Then, Patent Document 6 proposes an amorphous film, which is a DLC film for piston ring which has a thickness of at least 10 μm and contains a ta-c type DLC not containing hydrogen, and by doping B, O, and Si, the $sp^3$ ratio in the outer side 1 μm to 3 μm of the ta-c type DLC film is reduced, which has excellent friction during leveling, improves heat resistance under inadequate lubrication environments, and has an effect of inhibiting remains, but still does not sufficiently balance low-friction properties and wear resistance.

PRIOR ART DOCUMENT

Patent Document

Patent Document 1: Japanese Patent Publication Gazette No. 2001-261318
Patent Document 2: Japanese Patent Publication Gazette No. H10-87396
Patent Document 3: Japanese Patent Publication Gazette No. 2009-184859
Patent Document 4: Japanese Patent Publication Gazette No. 2002-327271
Patent Document 5: Japanese Patent Publication Gazette No. 2011-148686
Patent Document 6: Japanese Patent Publication Gazette No. 2013-528697

SUMMARY OF THE INVENTION

Problem to be Solved in the Invention

Like the above, the prior arts are insufficient in balancing low-friction properties and wear resistance, and are also insufficient in improving chipping resistance or peeling resistance.

Therefore, an issue of the present invention is to provide a coating film, a manufacturing method for the same, and a PVD device used in the manufacturing method that not only sufficiently improve the balance of low-friction properties and wear resistance, but also improve chipping resistance (defect resistance) and peeling resistance.

Technical Means of Solving the Problem

In a situation where a hard carbon film is formed as a coating film of a sliding member, an vapor-phase growth method such as a PVD method or a CVD method is always used; in this case, if the substrate temperature becomes high, it is not easy to generate $sp^3$ bonding carbon. For forming a hard carbon film rich in $sp^2$ bonding carbon (rich graphite), that is, low-hardness hard carbon film, the substrate temperature is controlled to be below 200° C. to carry out film-forming.

However, the inventor has conducted various experiments and researches to solve the issue, and in this case, not limited by the existing concept, a PVD method is used to increase the substrate temperature to form the hard carbon film, which obtains a result that surprises the inventor, that is, the substrate temperature is set as a temperature exceeding 200° C., and preferably above 210° C.

More preferably, in a situation where the hard carbon film is formed above 220° C., a hard carbon film whose structure is entirely different from the conventional one may be formed.

Specifically, by observing the cross section of the hard carbon film obtained through the bright-field Transmission Electron Microscope (TEM) image, a result is obtained that white-colored hard carbon is in a mesh shape extending in the thickness direction and black-colored hard carbon is dispersed into the cavities in the mesh.

Moreover, by measuring sliding characteristics of the hard carbon film, a result is obtained that not only is the balance of low-friction properties and wear resistance originally in the trade-off relation improved more than before, but also chipping resistance (defect resistance) or peeling resistance is also sufficiently improved, and the hard carbon film coating a surface of a member requiring slidability is preferred.

Generally, it is considered that the reasons for achieving such an effect are as follows.

That is, during display in the bright-field TEM image, the white-colored hard carbon is of relatively lower density, while the black-colored hard carbon is of relatively higher density.

Moreover, the low-density white-colored hard carbon is soft, and is more resistant to impact and more excellent in low-friction properties than the high-density black-colored hard carbon. Therefore, forming a three-dimensional connected structure by connecting the white-colored hard carbon into a mesh shape in the thickness direction can efficiently disperse a stress applied externally, which not only can improve low-friction properties but also can improve chipping resistance.

Besides, the structure that the low-density white-colored hard carbon is successively connected in the thickness direction is more resistant to peeling, and thus such hard carbon film can give play to excellent peeling resistance.

Then, the high-density black-colored hard carbon dispersed into the cavities in the mesh of the low-density white-colored hard carbon is harder than the white-colored hard carbon, and thus wear resistance is increased.

As a result, in the situation where such a hard carbon film coats the surface of the member requiring slidability, compared with the coating of the existing hard carbon film, low-friction properties, wear resistance, chipping resistance and peeling resistance can be enhanced significantly.

In addition, such hard carbon in a mesh shape in the thickness direction forms a film preferably using a PVD method.

That is, the hard carbon may also form a film using a CVD method all the time, but in the case of the CVD method, the film-forming temperature is high, and thus it is not suitable for serving as a film-forming method of forming high-density black-colored hard carbon. The inventor finds from results of the study that the hard carbon film with that structure can be formed by using a PVD method and properly controlling the film-forming temperature. In addition, hydrogen-containing gas raw materials are used in the CVD method, and thus the hardness of the film is reduced easily and low-friction properties in the oil are also poor. However, solid carbon raw materials are used at the cathode in the PVD method, which thus has the following advantage: the hard carbon with excellent low-friction properties in the oil can form a film with high hardness not containing hydrogen or impure metal.

Moreover, when the mesh-shaped hard carbon layer is measured using Raman spectroscopy, if the ID/IG ratio of the Raman spectrum D band peak area intensity and G band peak area intensity is too great, it is easy to reduce the wear resistance; on the other hand, if the ID/IG ratio is too small, the improved effect of the chipping resistance is insufficient.

The inventor finds from results of the study that the ID/IG ratio is preferably 1-6, and more preferably 1.5-5. By controlling the ration to be within such a range, the wear resistance and the chipping resistance can be sufficiently achieved at the same time.

The invention recited in the technical solution 1, based on the understanding, is a coating film,
coated on a substrate surface, wherein
the coating film has a hard carbon that presents relatively black and white when observed in a cross-sectional bright-field TEM image,
a mesh-shaped hard carbon layer is formed using a PVD method, wherein the mesh-shaped hard carbon layer is that white-colored hard carbon in a mesh shape extending in the thickness direction and black-colored hard carbon dispersed into the cavities in the mesh, and
the ID/IG ratio is 1-6 when the mesh-shaped hard carbon layer is measured using Raman spectroscopy, said ratio being the ratio of the Raman spectrum D band peak area intensity and G band peak area intensity.

The invention recited in the technical solution 2 is the coating film according to the technical solution 1, wherein
the white-colored hard carbon in a mesh shape extending in the thickness direction has a width of 0.5 nm to 10 nm.

The absorbing ability for the shock from the outside can be increased by thinning the width of the white-colored hard carbon in a mesh shape extending in the thickness direction (the line width of the white-colored hard carbon forming a mesh). In addition, if the width of the white-colored hard carbon becomes thin, the mesh becomes thin, and thus the black-colored hard carbon dispersed into the cavities in the mesh becomes small, improving the wear resistance. As a result, a coating film with excellent balance of chipping resistance and wear resistance can be provided. The width is preferably 0.5 nm to 10 nm, and more preferably 1 nm to 5 nm.

The invention recited in the technical solution 3 is the coating film according to the technical solution 1 or technical solution 2, wherein
the white-colored hard carbon in a mesh shape extending in the thickness direction displays an amorphous scattering pattern in electron beam diffraction.

By making the white-colored hard carbon in a mesh shape extending in the thickness direction become amorphous, crystalline orientation disappears, and chipping resistance in the case of loading repeated stress or positive or negative stress is increased. In addition, by connecting the amorphous hard carbon into a mesh shape, the conductivity of the mesh-shaped hard carbon layer is reduced, and if it is measured using a bi-terminal method, the resistance of 1-1000 Ω·cm is displayed even if it coats a conductor.

The invention recited in the technical solution 4 is the coating film according to any of the technical solution 1 to the technical solution 3, wherein
at least one part of the black-colored hard carbon dispersed into the cavities in the mesh displays a diffraction spot in a position at lattice spacing of 0.3 nm to 0.4 nm in electron beam diffraction.

The black-colored hard carbon dispersed into the cavities in the mesh may be basically amorphous, but preferably, at least one part thereof contains graphite with crystallinity, especially in the case of the hard carbon that displays a diffraction spot in a position of 0.3 nm to 0.4 nm in electron beam diffraction, alignment is carried out by stacking graphite or graphene C surface, (002) surface in the thickness direction, and thus the lubricity is increased.

The invention recited in the technical solution 5 is the coating film according to any of the technical solution 1 to the technical solution 4, wherein
the hydrogen content of the mesh-shaped hard carbon layer is below 10 atom %.

By comparing the hard carbon layer with more hydrogen content with the hard carbon layer not containing hydrogen, the friction reduction effect in the oil is low, and it is easy to reduce the hardness and the wear resistance. In the case that the hydrogen content is below 10 atom %, the hard carbon layer becomes high hardness on the whole, and thus the wear resistance can be improved. The hydrogen content is preferably below 5 atom %. Then, in addition to the hydrogen, regarding N or B, Si or other metal elements, preferably, the elements are not contained other than inevitable impurities.

The invention recited in the technical solution 6 is the coating film according to any of the technical solution 1 to the technical solution 5, wherein
the nano indentation hardness of the mesh-shaped hard carbon layer is 10 GPa to 35 GPa.

If the nano indentation hardness is too great, it is easy to reduce the chipping resistance. On the other hand, if the nano indentation hardness is too small, the wear resistance is easy to become insufficient. More preferably, the nano indentation hardness is 15 GPa to 30 GPa, which can especially increase the chipping resistance effectively.

The invention recited in the technical solution 7 is the coating film according to any of the technical solution 1 to the technical solution 6, wherein
the $sp^2/sp^3$ ratio of the white-colored hard carbon in a mesh shape extending in the thickness direction is 0.2 to 0.9.

If the $sp^2/sp^3$ ratio is too small, the improved effect of the chipping resistance is insufficient. On the other hand, if the $sp^2/sp^3$ ratio is too great, the wear resistance is reduced significantly. Preferably, the $sp^2/sp^3$ ratio is 0.2 to 0.9. By controlling the ratio to be within such a range, the chipping resistance and the wear resistance can be sufficiently achieved at the same time. In addition, when subject to high load or repeated load, the coating film is not easy to damage. A preferred range is 0.22 to 0.8.

The invention recited in the technical solution 8 is the coating film according to any of the technical solution 1 to the technical solution 7, wherein
the $sp^2/sp^3$ ratio of the black-colored hard carbon dispersed into the cavities in the mesh is 0.15 to 0.7.

If the $sp^2/sp^3$ ratio is 0.15 to 0.7, excellent wear resistance can be obtained. A preferred range is 0.2 to 0.55.

The invention recited in the technical solution 9 is the coating film according to any of the technical solution 1 to the technical solution 8, wherein
the mesh-shaped hard carbon layer further has a lower non-mesh-shaped hard carbon layer,
the lower hard carbon layer displays a color darker than the white-colored hard carbon in a mesh shape extending in the thickness direction in the bright-field TEM image, and
the $sp^2/sp^3$ ratio is 0.1 to 0.3.

The hard carbon layer in a mesh shape extending in the thickness direction and displaying a color darker than the white-colored hard carbon is of higher density and excellent wear resistance, especially when the $sp^2/sp^3$ ratio is controlled to be within the range of 0.1 to 0.3, preferably 0.15 to 0.3, the wear resistance can be sufficiently increased.

Moreover, by setting such a hard carbon layer as a lower layer and stacking the mesh-shaped hard carbon layer with excellent chipping resistance to make a coating film of a two-layer structure, a coating film that can achieve both excellent chipping resistance and excellent wear resistance can be provided.

The invention recited in the technical solution 10 is the coating film according to the technical solution 9, wherein the nano indentation hardness of the lower hard carbon layer is 35 GPa to 80 GPa.

If the nano indentation hardness of the lower hard carbon layer is 35 GPa to 80 GPa, the wear resistance of the coating film can be further increased, which is thus preferred.

The invention recited in the technical solution 11 is the coating film according to any of the technical solution 1 to the technical solution 10, wherein the mesh-shaped hard carbon layer grows to be fan-shaped from the lower hard carbon.

In a situation where the mesh-shaped hard carbon layer begins to grow to be an obconical fan shape from the lower hard carbon, a portion with a structure that lower dark hard carbon is coexisted with upper white-colored hard carbon is formed in the growth direction thereof, and a portion whose mixing ratio changes in the thickness direction is generated. As a result, the membrane characteristics changes smoothly from the lower layer to the upper layer, which can suppress peeling of the lower layer from the mesh-shaped hard carbon layer interface.

In this way, the mesh-shaped hard carbon layer can begin to grow from the lower hard carbon, and during film-forming, a CVD structure that the white-colored hard carbon is in a mesh shape extending in the thickness direction is efficiently obtained; therefore, excellent chipping resistance and low-friction properties can be achieved even if the PVD method is used as a film-forming method.

The invention recited in the technical solution 12 is the coating film according to any of the technical solution 1 to the technical solution 11, wherein The fan-shaped growing starts with the white-colored hard carbon.

In a situation that the mesh-shaped hard carbon layer grows to an obconical fan shape by using the white-colored hard carbon as a growth starting point, a portion with a structure that lower dark hard carbon is coexisted with upper white-colored hard carbon is formed in the growth direction thereof, and a portion whose mixing ratio changes in the thickness direction is generated. As a result, the membrane mass changes smoothly from the lower layer to the upper layer, which can suppress peeling of the lower layer from the mesh-shaped hard carbon layer interface.

In this way, the mesh-shaped hard carbon layer can grow by using the white-colored hard carbon as a growth starting point, and during film-forming, a CVD structure that the white-colored hard carbon is in a mesh shape extending in the thickness direction is efficiently obtained; therefore, excellent chipping resistance and low-friction properties can be achieved even if the PVD method is used as a film-forming method.

The invention recited in the technical solution 13 is a manufacturing method for a coating film, using an arc PVD method, controlling the bias voltage, arc current, heater temperature and/or furnace pressure in a manner of maintaining a substrate temperature exceeding 200° C. and below 300° C., and coating the substrate surface with the hard carbon film while rotating and/or revolving the substrate, thus manufacturing the coating film according to any of the technical solution 1 to the technical solution 12.

The arc PVD method is a film-forming method that can generate active carbon particles with a high ionization rate and coating the same. By optimizing the bias voltage or arc current, heater temperature, furnace pressure and so on, white-colored hard carbon can be generated from the active carbon particles, and a mesh-shaped hard carbon layer is formed by taking it as a growth starting point.

Moreover, by rotating and/or revolving the substrate, although it is a PVD method, the white-colored hard carbon layer with a greater $sp^2/sp^3$ ratio also grows to be a mesh shape, and gradually grows in a CVD manner by forming black-colored hard carbon in cavities of the mesh, and the mesh-shaped hard carbon layer can be formed.

In addition, during optimization of the parameters, a particularly important parameter is a substrate temperature controlled through a bias voltage, an arc current, and a heater.

That is, in the case that the bias voltage is above −50 V but below −300 V, it is difficult to form the mesh-shaped hard carbon layer.

Moreover, if the arc current is less than 10 A, discharge is difficult, and it is easy to reduce the wear resistance when the arc current is above 200 A.

In addition, if the substrate temperature is below 200° C., it is difficult to form the mesh-shaped hard carbon layer, and it is easy to reduce the wear resistance of the mesh-shaped hard carbon layer when the substrate temperature is above 300° C. Therefore, the substrate temperature preferably exceeds 200° C. but does not exceed 300° C., more preferably exceeds 200° C. but does not exceed 290° C., and then preferably 210° C. to 290° C., and further preferably 210° C. to 280° C.

The invention recited in the technical solution 14 is a PVD device, for manufacturing method for a coating film according to the technical solution 13, wherein the PVD device is an arc PVD device having a control mechanism that controls a substrate temperature exceeding 200° C. and below 300° C.

In a situation where the hard carbon is formed using an arc PVD method, depending on different bias voltages of the arc PVD device, sometimes a situation occurs that the substrate temperature is below 200° C. or the substrate temperature is above 300° C. during film-forming, the coating film with such a structure may not be formed.

Therefore, in the arc PVD device of the present invention, a control mechanism that can make control in a manner of maintaining a substrate temperature exceeding 200° C. but not exceeding 300° C., to uniformly heat the substrate at an appropriate temperature.

Regarding a specific control method, the following methods may be listed: a method of setting a heater for uniformly heating a substrate; or a method of importing a heating mechanism and/or a cooling mechanism on a fixture provided with a substrate; a method of automatically controlling a bias voltage or an arc current according to a substrate temperature monitored via a thermocouple and so on.

The invention recited in the technical solution 15 is the PVD device according to the technical solution 14, including:

a substrate supporting mechanism that supports the substrate to make it rotate and revolve freely; and a rotary control mechanism that controls the speed of rotation and/or revolution of the substrate.

By supporting the substrate to make it rotate and revolve freely and controlling it to rotate and revolve, the substrate can be heated more uniformly.

In addition, the present invention can be grasped from the following aspects.

That is, the invention recited in the technical solution 16 is a coating film coated the substrate surface, wherein a mesh-shaped hard carbon layer is formed using a PVD method, wherein the mesh-shaped hard carbon layer has two kinds of hard carbon with relatively different $sp^2/sp^3$ ratios, the hard carbon with the higher $sp^2/sp^3$ ratio is in a mesh shape extending in the thickness direction, and the hard carbon with the lower $sp^2/sp^3$ ratio is dispersed into the cavities in the mesh, and the ID/IG ratio is 1-6 when the mesh-shaped hard carbon layer is measured using Raman spectroscopy, said ratio being the ratio of the Raman spectrum D band peak area intensity and G band peak area intensity.

The invention recited in the technical solution 17 is a coating film coated on the substrate surface, wherein a mesh-shaped hard carbon layer is formed using a PVD method, wherein the mesh-shaped hard carbon layer has a white and black contrast in a cross-sectional bright-field TEM image, white-colored hard carbon is in a mesh shape extending in the thickness direction by starting to branch from a white point, and black-colored hard carbon is dispersed into the cavities thereof, and the ID/IG ratio is 1-6 when the mesh-shaped hard carbon layer is measured using Raman spectroscopy, said ratio being the ratio of the Raman spectrum D band peak area intensity and G band peak area intensity.

The invention recited in the technical solution 18 is a coating film coated on the substrate surface, wherein a mesh-shaped hard carbon layer is formed using a PVD method, wherein the mesh-shaped hard carbon layer is that hard carbon with a relatively higher $sp^2/sp^3$ ratio is in a mesh shape extending in the thickness direction by starting to branch from a point with a relatively higher $sp^2/sp^3$ ratio, and hard carbon with a relatively lower $sp^2/sp^3$ ratio is dispersed into the cavities thereof, and the ID/IG ratio is 1-6 when the mesh-shaped hard carbon layer is measured using Raman spectroscopy, said ratio being the ratio of the Raman spectrum D band peak area intensity and G band peak area intensity.

The invention recited in the technical solution 19 is a coating film coated on the substrate surface, wherein a mesh-shaped hard carbon layer is formed using a PVD method, wherein the mesh-shaped hard carbon layer has a white and black contrast in a cross-sectional bright-field TEM image, white-colored hard carbon is in a mesh shape extending in the thickness direction by branching, and black-colored hard carbon is dispersed into the cavities thereof, and the ID/IG ratio is 1-6 when the mesh-shaped hard carbon layer is measured using Raman spectroscopy, said ratio being the ratio of the Raman spectrum D band peak area intensity and G band peak area intensity.

The invention recited in the technical solution 20 is a coating film coated on the substrate surface, wherein a mesh-shaped hard carbon layer is formed using a PVD method, wherein the mesh-shaped hard carbon layer is that hard carbon with a relatively higher $sp^2/sp^3$ ratio is in a mesh shape extending in the thickness direction by branching, and hard carbon with a relatively lower $sp^2/sp^3$ ratio is dispersed into the cavities thereof, and the ID/IG ratio is 1-6 when the mesh-shaped hard carbon layer is measured using Raman spectroscopy, said ratio being the ratio of the Raman spectrum D band peak area intensity and G band peak area intensity.

Effect of the Invention

According to the present invention, a coating film, a manufacturing method for the same, and a PVD device used in the manufacturing method that not only sufficiently improve the balance of low-friction properties and wear resistance, but also improve chipping resistance (defect resistance) and peeling resistance can be provided.

DESCRIPTION OF THE EXAMPLES

The present invention is described below according to implementation forms and with reference to the drawings.

1. Substrate

In the present invention, the substrate to form a coating film is not particularly limited, and in addition to iron-based substrates, non-iron-based metal or ceramic, hard composite and other substrates can be used. For example, carbon steel, alloy steel, quenched steel, high-speed tool steel, cast iron, aluminium alloy, Mg alloy or superhard alloy etc. can be listed, and if the film-forming temperature of the coating film is considered, a substrate whose characteristics are not significantly degraded at a temperature over 200° C. is preferred.

2. Intermediate Layer

When the coating film is formed, an intermediate layer is preferably preset on the substrate. Thus, adhesion between the substrate and the coating film may be increased, and in the case that the coating film is worn, the intermediate layer can be exposed to give play to the function of wear resistance.

At least one of Cr, Ti, Si, W, B and other elements can be employed for such an intermediate layer. In addition, nitride, carbon nitride, carbide and the like of at least one of Cr, Ti, Si, Al, etc. can be used in a lower layer of the elements, and such compounds, for example, include CrN, TiN, CrAlN, TiC, TiCN, TiAlSiN and the like.

3. Coating Film

The coating film of the present invention has two types of hard carbon that presents relatively black and white when observed in a cross-sectional bright-field TEM image, white-colored hard carbon is in a mesh shape extending in the thickness direction, and black-colored hard carbon is dispersed into the cavities in the mesh, to form a mesh-shaped hard carbon layer.

Figure 1:
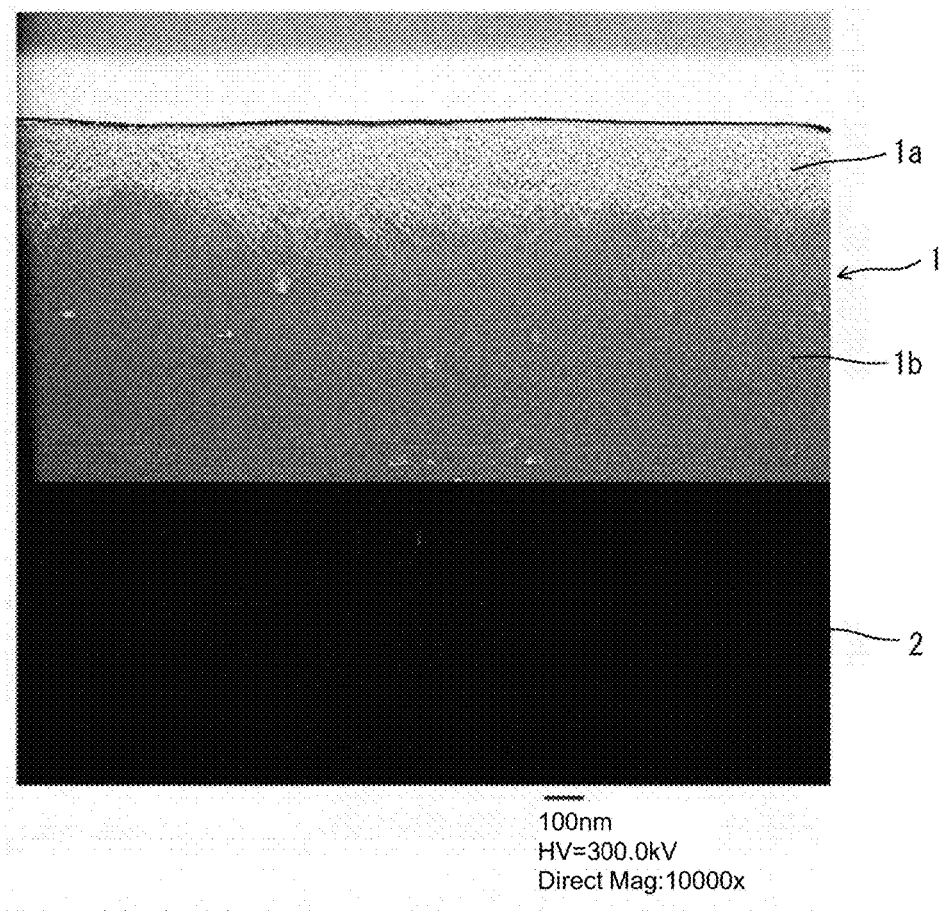
FIG. 1 is a cross-sectional bright-field TEM image of a coating film according to an implementation form of the present invention.
Figure 2:
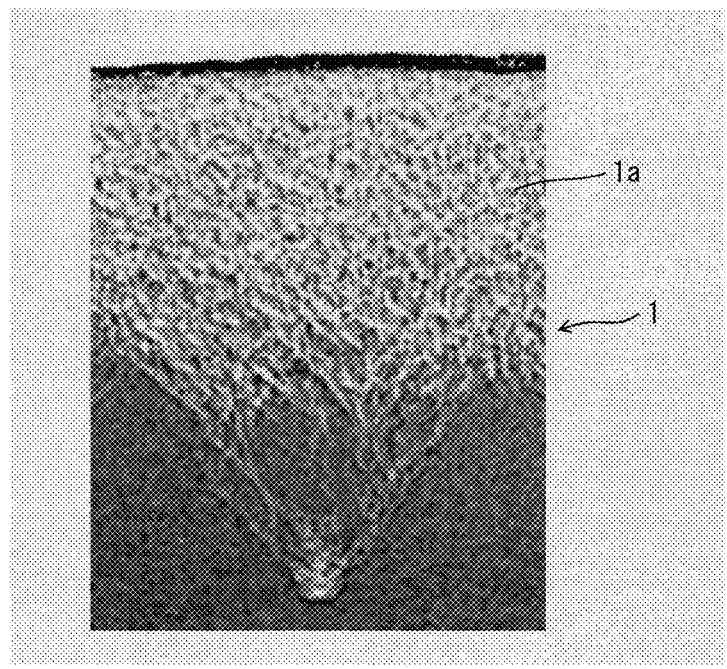
FIG. 2 is an enlarged view of one part of FIG. 1.

FIG. 1 is a cross-sectional bright-field TEM image of a coating film according to an implementation form of the present invention, and FIG. 2 is an enlarged view of one part of the bright-field TEM image of FIG. 1.

In FIG. 1, 1 is a coating film, and 2 is a substrate. It is obtained from FIG. 1 that a mesh-shaped hard carbon layer 1a is formed on an upper layer (surface side) of the coating film 1, and the mesh-shaped hard carbon layer 1a is that mesh-shaped white-colored hard carbon (low-density hard carbon) expands in a fan shape (obconical) towards the surface of the coating film 1 by taking the white-colored hard carbon as a starting point, and the black-colored hard carbon (high-density hard carbon) is dispersed in the cavities of the mesh.

It is also obtained that a lower layer 1b of hard carbon not mesh-shaped and darker than the white-colored hard carbon is present at a lower side (substrate side) of the mesh-shaped hard carbon layer 1a, and a portion with a structure that the hard carbon at the lower layer 1b is coexisted with the mesh-shaped hard carbon is provided between the mesh-shaped hard carbon layer 1a and the lower layer 1b.

Also, the line width of the mesh of the mesh-shaped hard carbon layer 1a can be measured through the bright-field TEM image of FIG. 2.

In the present invention, the white-colored hard carbon in a mesh shape preferably has a width of 0.5 nm to 10 nm, and more preferably 1 nm to 5 nm, and has a diffuse scattering pattern (amorphous scattering pattern) in electronic beam diffraction. In addition, the $sp^2/sp^3$ ratio is 0.2 to 0.9, and more preferably 0.22 to 0.8.

On the other hand, preferably, at least one part of the black-colored hard carbon displays a diffraction spot in a position at lattice spacing of 0.3 nm to 0.4 nm in electron beam diffraction. In addition, the $sp^2/sp^3$ ratio is 0.15 to 0.7, and more preferably 0.2 to 0.55.

In addition, the hydrogen content of the mesh-shaped hard carbon layer 1a is below 10 atom %, and more preferably below 5 atom %, and the remaining portion substantially only contains carbon. In addition to hydrogen, regarding N, B, Si and other metal elements, preferably the elements are not contained other than inevitable impurities. Besides, the nano indentation hardness is preferably 10 GPa to 35 GPa, and more preferably 15 GPa to 30 GPa, and the ID/IG ratio is 1-6, and more preferably 1.5-5.

On the other hand, the nano indentation hardness of the lower layer 1b is preferably 35 GPa to 80 GPa, and the $sp^2/sp^3$ ratio is 0.1 to 0.3, and more preferably 0.15 to 0.3.

In addition, the situation where the mesh-shaped hard carbon layer and the non-mesh-shaped hard carbon layer are stacked to be coated is also included in the present invention.

4. Manufacturing Method of a Coating Film and Arc PVD Device (1) Manufacturing Method When the coating film 1 is formed, an arc PVD method, a sputtering PVD method and the like may be used, and particularly the arc PVD method is preferred.

In the arc PVD method, high-temperature molten particles fly out of a target with a certain probability. The particles are also referred to as droplets, and have high activity at high temperatures. Therefore, in the case that carbon is used as a target, a white-colored (low density) hard carbon particle with high activity at high temperatures flies out with a certain probability, and as illustrated in FIG. 1, the high-activity white-colored particle becomes a starting point while the white-colored hard carbon layer grows to be fan-shaped and is easy to grow into a mesh shape in the thickness direction.

In the case that the coating film is formed using the arc PVD method, a bias voltage or arc current is regulated, or the substrate is heated using a heater, or the substrate is cooled in a forced way by importing a cooling mechanism on a fixture (holder) provided with the substrate, and a manufacturing condition is adjusted in a manner of making the substrate temperature over 200° C. but below 300° C., and more preferably 220° C. to 275° C.

In addition, at this point, the bias voltage is preferably −50 V to −300 V, in addition to heating of the heater or cooling from the holder, the substrate temperature may also be controlled by changing the arc current, or applying a bias voltage intermittently such as discontinuously or pulse-like to change the voltage value, which is not particularly limited.

In the existing arc PVD method, film-forming is carried out by taking a bias voltage or arc current as a parameter. As a result, the furnace temperature is not uniform due to thermal capacity of a workpiece, a mounting fixture or charge quantity, and the substrate temperature is not sufficiently controlled. That is, a concept of strictly controlling the substrate temperature is lacking, and there is no understanding about the following effect: the structure of the hard carbon layer can be controlled by controlling the substrate temperature, and low-friction properties and wear resistance can be balanced by making the structure into a mesh shape, and thus chipping resistance or peeling resistance can be improved.

In addition, during film-forming, preferably, the substrate rotates at 10 rpm to 200 rpm, or revolves at 1 rpm to 20 rpm.

Under such a manufacturing condition, although the reason for forming the mesh-shaped hard carbon layer is uncertain, the reason may be considered as follows.

That is, in the case that the substrate temperature exceeds 200° C. but does not exceed 300° C., the temperature is high, and thus the hard carbon layer is easy to grow as a low-density hard carbon layer. However, if the substrate rotates at 10 rpm to 200 rpm or revolves at 1 rpm to 20 rpm, although the substrate temperature is maintained exceeding 200° C. but not exceeding 300° C., kinetic energy of the carbon ions flying out of the target varies greatly due to whether the carbon ions impact the substrate from the front or obliquely.

That is, the carbon ions incident into the substrate from the front, due to great impact energy, become a high temperature when impacting the substrate and are easy to become hard carbon which is white-colored and has low density or a great $sp^2/sp^3$ ratio; on the other hand, the carbon ions incident into the substrate obliquely, due to small impact energy, become a lower temperature when impacting the substrate than the situation of being incident from the front, and form a film as hard carbon which is black-colored and has high density or a small $sp^2/sp^3$ ratio.

As a result, for the hard carbon layer forms a film by rotating or revolving the substrate, white-colored hard carbon and black-colored hard carbon are also coexisted even if in the same film-forming thickness position.

Also, if it further coats the upper layer, as the substrate temperature becomes a high temperature over 200° C. but below 300° C., on the film where the carbon ions are incident from the front, the white-colored hard carbon grows into a mesh shape. On the other hand, the carbon ions incident obliquely form black-colored hard carbon in the cavities of the mesh.

As a result, the structure of the following mesh-shaped hard carbon may be formed: as the hard carbon is low-density and sparse, it is visible in the bright-field TEM image that the white-colored hard carbon is in a mesh shape, and in the cavities, as the hard carbon is high-density and dense, it is visible that the black-colored hard carbon is coexisted.

Then, if the substrate temperature is over 225° C., the mesh-shaped hard carbon is easy to be locally graphitized, and sometimes crystallization is carried out locally in the black-colored hard carbon. If such crystallization is carried out, a mesh-shaped structure where a white portion and a locally graphitized and black portion are coexisted is present in the bright-field TEM image.

Herein, if the black portion is analyzed through electronic beam diffraction, a weak diffraction spot is observed in a position of 0.3 nm to 0.4 nm. It can be considered that the position is equivalent to the graphite or graphene c surface, that is, (002) surface having a $sp^2$ structure, the mesh-shaped hard carbon having such a diffraction spot can particularly improve the low-friction properties as the graphene c surface is aligned in a direction parallel to the substrate.

In addition, hereinabove, the reasons for setting the substrate temperature above 200° C. but below 300° C. are as follows: it can be considered that, in the case of below 200° C., even if the carbon ions are incident into the substrate from the front, they are difficult to grow into a mesh shape as white-colored hard carbon; on the other hand, in the case of above 300° C., even if the carbon ions are incident obliquely into the substrate due to a rotating fixture, they do not form black-colored hard carbon but are easy to form white-colored hard carbon; as a result, it is difficult to form the mesh-shaped hard carbon layer of the present invention in which white-colored hard carbon is in a mesh shape extending in the thickness direction and black-colored hard carbon is dispersed into the cavities in the mesh.

Also, as stated hereinabove, in addition to adjusting the bias voltage, the substrate temperature can be adjusted by adjusting the arc current, the heater temperature, the furnace pressure and the like, and thus the bias voltage is not limited particularly; however, if the following situation is considered: it is difficult to form a mesh-shaped hard carbon layer if the bias voltage is over −50 V, and it is difficult to form a mesh-shaped DLC if the bias voltage is less than −300 V, the bias voltage is preferably −50 V to −300 V, and more preferably −100 V to −275 V. In addition, regarding the furnace pressure, in the case of a vacuum environment set as $10^{-4}$ Pa to $5 \times 10^{-1}$ Pa, compared with the situation where hydrogen or nitrogen is imported, a low-friction and high-wear-resistance hard carbon film can be obtained, which is thus preferred.

With respect to the present invention, in the existing manufacturing method of a hard carbon film, especially in the case that a film is formed using an arc PVD method, in order to form a high-density coating film, the bias voltage is generally controlled, to form a film under a condition that the substrate temperature is over 200° C. and does not rise.

In addition, the following technology is put forward: the bias voltage is set as −500 V to −1000 V, and after the inner layer (lower layer) is coated in the bright-field TEM image to be visible as a white layer, under a condition that the bias voltage is −100 V, a hard carbon layer darker than the inner layer in the bright-field TEM image forms a film in the upper layer thereof; however, tilting the density of the hard carbon film in the thickness direction by controlling the bias voltage is not disclosed herein, it is impossible to form a structure of mesh-shaped hard carbon highly controlled, and it is impossible to manufacture, like the hard carbon film of the present invention, a coating film which sufficiently balances low-friction properties and wear resistance, has excellent sliding characteristics and also has sufficiently excellent chipping resistance and peeling resistance.

The coating film in the implementation form can be manufactured using an arc PVD device, and a specific film-forming device, for example, may be an arc PVD device M720 manufactured by the Japanese ITF Company. In the following, manufacturing of a coating film using the arc PVD device is specifically described.

At first, after CrN coats a metal raw material becoming a substrate with a thickness of 10 μm, the substrate is taken out of the PVD device, to be ground in a manner that the surface roughness Rz becomes 0.3 μm. Then, the substrate is set in an arc PVD device having a rotating and revolving fixture.

Then, the magnitude of the bias voltage or the arc current is adjusted, or the time of becoming a non-bias voltage is intermittently imported to cool the substrate, or the substrate is heated using a heater, or the substrate is rotated, to make control in a manner that the substrate temperature is over 200° C. but below 300° C., such that the hard carbon film grows into a mesh shape.

As stated hereinabove, the detailed film-forming mechanism of the present invention is unknown, but it can be considered that, by placing the substrate temperature in such a high temperature environment, a white-colored hard carbon particle with high activity flying into the substrate with a certain probability becomes a starting point, film growth of the hard carbon is affected by the lower layer, and the white-colored hard carbon grows into a mesh shape in the thickness direction in a manner of CVD-growing in the black-colored hard carbon.

At this point, the film is formed by rotating the substrate in the high-temperature film-forming environment, the white-colored hard carbon and the black-colored hard carbon are easy to coexist in either of the thickness direction and the rotating direction, and the white-colored hard carbon is easy to be coated in a mesh shape in the thickness direction.

(2) Arc PVD Device

Figure 3:
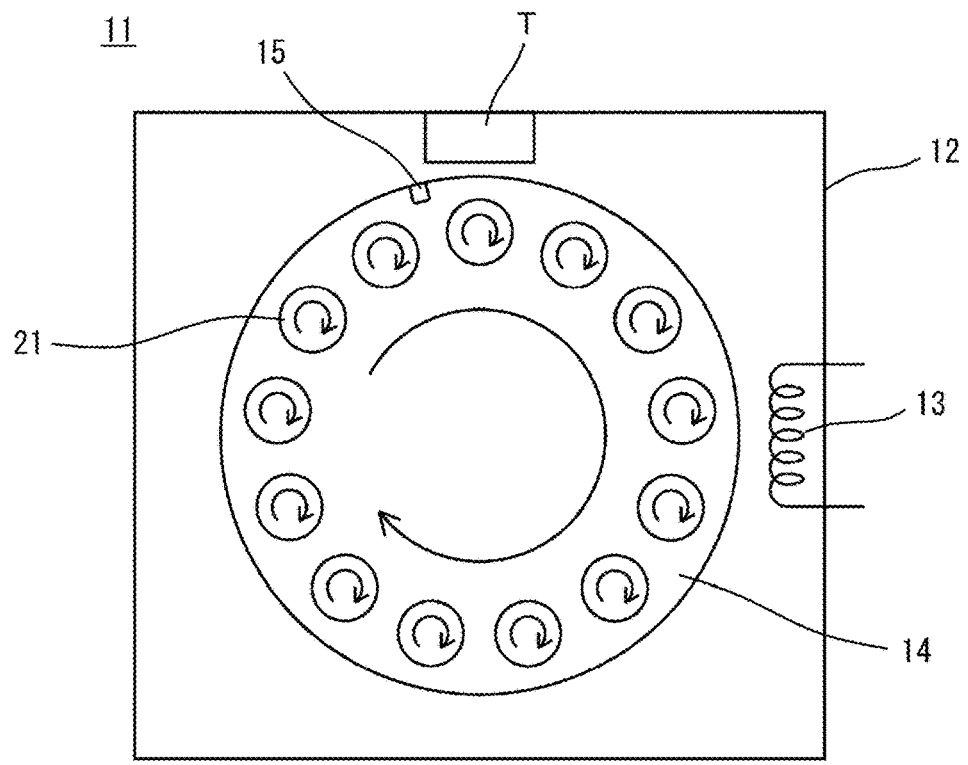
FIG. 3 is a diagram that schematically indicates main parts of a furnace for use in film-forming of a manufacturing device according to an implementation form of the present invention.

Then, the arc PVD device of the implementation form is specifically described. FIG. 3 is a diagram that schematically indicates main parts of a furnace for use in film-forming of the arc PVD device according to the implementation form.

The arc PVD device includes a furnace 11 for use in film-forming and a control device (not shown). In the furnace 11, a vacuum chamber 12, a plasma generation device (not shown), a heater 13, a rotating and revolving fixture 14 as a substrate supporting device, a thermocouple (T.C.10 mm square bar) 15 as a thermometer measuring device, a bias power source (not shown) and a pressure adjusting device (not shown) that adjusts the pressure in the furnace.

In addition, preferably, a cooling heating device that supplies cooling water and/or warm water or steam is provided on the substrate supporting device. In addition, T is a target (carbon target), and 21 is a substrate (iron substrate) with an intermediate layer formed thereon. In addition, actually there are 5 targets T, but for the sake of simplification, only 1 target is depicted in FIG. 3.

The plasma generation device includes an arc power source, a cathode and an anode, by discharge through a vacuum arc between the cathode and the anode, carbon is evaporated from the carbon target T as a cathode material, and a plasma containing an ionized cathode material (carbon ions) is generated. The bias power source applies a fixed bias voltage to the substrate 21 to make the carbon ions fly towards the substrate 21 with suitable kinetic energy.

The rotating and revolving fixture 14 is disk-like, and freely rotates in the arrow direction with the center of the circle as a rotation center; on concentric circles with the center of the disk as the center, multiple rotary shafts perpendicular relative to the disk are provided at an equal interval. Multiple substrates 21 are retained by the rotary shafts respectively, and freely rotate in the arrow direction. Thus, the substrates 21 are retained on the rotating and revolving fixture 14 to rotate and revolve freely. In addition, for the rotating and revolving fixture 14, a metal material with high thermal conductivity such as stainless steel is used in a manner of quickly transferring heat between the substrates 21 and the rotating and revolving fixture 14 and making temperatures of the substrates 21 and the rotating and revolving fixture 14 substantially equal.

The heater 13 and the cooling device heat and cool the rotating and revolving fixture 14 respectively, thus indirectly heating and cooling the substrates 21. Here, the heater 13 is formed in a manner of regulating the temperature. On the other hand, the cooling device is formed in a manner of adjusting a supply speed of cooling water. Specifically, the cooling device is formed in a manner of supplying the cooling water for the rotating and revolving fixture 14 and/or the rotary shaft during implementation of cooling and stopping supplying the cooling water when the cooling stops, and is formed in a manner of supplying warm water or steam for the rotating and revolving fixture 14 and/or the rotary shaft during heating and stopping supplying the warm water or steam when the heating stops. In addition, the thermocouple 15 is installed near the substrate 21, and is formed in a manner of indirectly measuring the substrate temperature to make at least one of the arc current value, the bias voltage value, and the heater temperature change in film-forming, thus controlling the substrate temperature to be a target substrate temperature.

Regarding the speed of the rotating and revolving fixture 14, the control device controls various speeds to be a fixed speed under a preselected combination of rotation and revolution in a manner of reliably forming a mesh-shaped hard carbon layer and also in a manner of forming a film without bias. In addition, according to the measurement results of the thermocouple 15 for the temperature of the substrate 21, the bias voltage, the arc current, the heater temperature, and the furnace pressure are optimized. Thus, the temperature of the substrate 21 during film-forming can be maintained within a temperature range of above 200° C. but below 300° C. Also, the work of the cooling device and the applied pattern of the bias voltage are controlled as required.

For example, a feedback system is preferably added, and the feedback system measures substrate temperatures in upper, middle and lower segments, properly changes arc current values in various positions of the upper, middle and lower segments during film-forming according to measured values, and set the substrate temperatures in various positions of the upper, middle and lower segments as a target temperature. Thus, stabilization of a film structure of hard carbon films of the upper, middle and lower segments can be achieved. In addition, in the film-forming of the existing hard carbon film, for film-forming parameters such as bias voltage, arc current and the like, in most cases, predetermined values are input into the control device before film-forming, film-forming is conducted under a pre-programmed film-forming condition, and there is no film-forming method and device that changes the arc current or heater temperature according to the substrate temperature measured in the middle of film-forming. Therefore, temperatures in the furnace or temperatures between batches are more non-uniform than the method of the present invention.

5. Inspection Method of Coating Film (1) Observation of TEM Structure

Through a TEM, a coating film thin-filmed using a Focused Ion Beam (FIB) is observed, for example, in a bright-field TEM image at an acceleration voltage of 300 kV.

(2) Measurement of Hydrogen Content

The hydrogen content in the coating film is measured through Hydrogen Forward Scattering (HFS) analysis.

(3) Judgment Method of Crude Density of the Hard Carbon Layer

The density of the hard carbon film may generally be measured using a Grazing Incidence X-ray Analysis (GIXA) method or a Grazing Incidence X-ray Reflectivity (GIXR) method. However, in a situation where small-density crude hard carbon and large-density dense hard carbon in the hard carbon layer are dispersed finely, it is difficult to utilize the method to measure density of various portions with high precision.

For such a hard carbon layer, for example, a method of effectively utilizing brightness of a bright-field TEM image disclosed in Japanese Patent Gazette No. 4918656 can be used. Specifically, in the bright-field TEM image, the lower the density is, the more the penetration amount of the electron beam increases. Therefore, in the case of forming the same substance, the lower the density is, the whiter the image is. So, in order to judge the density of each layer in multiple hard carbon layers of the same composition, preferably, a cross-sectional bright-field TEM image of the structure of the hard carbon layer is used.

In the case of the bright-field TEM image of FIG. 1, it can be seen that the color of the hard carbon layer of the surface portion is whiter than that of the hard carbon of the inner layer portion. Moreover, it can be obtained that, in the surface portion, it becomes a mesh-shaped hard carbon in which white-colored hard carbon is in a mesh shape extending in the thickness direction and black-colored hard carbon is dispersed into the cavities in the mesh. In order to make a color difference between white and black evident, color correction can be made in a manner of highlighting the contrast.

(4) Amorphous Judgment Method of the Coating Film

The coating film formed by thin-filming the cross section using FIB carries out electron beam diffraction under a condition of an acceleration voltage of 200 kV, a sample absorption current $10^{-9}$ A, and a beam spot size of 0.7 nm, to obtain an image of a tiny beam diffraction pattern, if the image is a diffuse scattering pattern, it is judged as amorphous, and if a spot-like pattern is observed, intensity spacing L near the spot is measured, and lattice spacing λ (nm) is calculated according to a relation that 2Lλ=camera length.

(5) Measuring Method of the ID/IG Ratio Obtained by Raman Spectroscopy

The hard carbon layer may be obtained by separating peaks of Raman spectrum obtained through Raman spectroscopy. Specifically, the peak position of the D band is fixed to 1350 cm$^{-1}$ for selection, the area intensity of this peak is set as ID, the peak position of the G band is near 1560 cm$^{-1}$ for free setting and peak separation, the area intensity of this peak is set as IG, and the ID/IG ratio is calculated.

(6) Measuring Method of the Sp$^2$/Sp$^3$ Ratio

The sp$^2$/sp$^3$ ratio can be calculated by calculating sp$^2$ intensity and sp$^3$ intensity through Electron Energy-Loss Spectroscopy (EELS). Specifically, with a spectral imaging method in a STEM (scanning TEM) mode, under a condition of an acceleration voltage of 200 kv, a sample absorption current of 10$^{-9}$ A, and a beam spot size of φ1 nm, EELS obtained at an interval of 1 nm is accumulated, to extract a C—K absorption spectrum in the form of average information from a region of about 10 nm, and the sp$^2$/sp$^3$ ratio is calculated.

If the measuring method is used, the sp2/sp3 ratio in a tiny portion can be measured; as the sp2/sp3 ratio of the high-density hard carbon is less than that of the low-density hard carbon, the judgment method of crude density of hard carbon can be substituted.

(7) Measuring Method of Conductivity of the Mesh-Shaped Hard Carbon Layer

A certain current flows between terminals with a bi-terminal method, and voltage reduction between two terminals is measured, to calculate the resistance and measure the resistance of the coating film.

(8) Measuring Method of Nano Indentation Hardness

The nano indentation hardness is measured using a Nanoindenter ENT1100a manufactured by Elionix Company under a condition of a load of 300 mgf, the load partition number of 500, and a load loading time of 1 s.

In addition, in the case that the mesh-shaped hard carbon layer is the uppermost layer, the nano indentation hardness can be measured from the film surface, and in the case that another coating layer instead of the uppermost layer is provided, the nano indentation hardness is measured after the cross section of the film is mirror-polished. In addition, regarding the film in the lower layer, the nano indentation hardness is also measured from the cross section of the film.

6. Effect of the Implementation Form

As stated above, the coating film of the present invention has the following mesh-shaped hard carbon layer which is a very special structure not seen in the existing hard carbon layer, that is, it is displayed in the bright-field image of the TEM structure that white-colored low-density hard carbon is in a mesh shape extending in the thickness direction, and it is displayed in the bright-field image of the TEM structure that black-colored high-density hard carbon is dispersed into the cavities thereof.

Moreover, the low-density white-colored hard carbon is soft and is more resistant to impact and more excellent in low-friction properties. Therefore, by forming such a structure as three-dimensionally connecting the white-colored hard carbon can efficiently disperse a stress applied externally, which is excellent in low-friction properties and chipping resistance. Besides, the structure that the white-colored hard carbon is successively connected in the thickness direction is more resistant to peeling.

Then, the black-colored hard carbon dispersed into the cavities of the white-colored hard carbon is of high density, and thus can increase wear resistance.

As a result, low-friction properties and wear resistance can be sufficiently balanced, sliding characteristics can be significantly increased compared with the existing coating film, and chipping resistance and peeling resistance can also be more increased than the existing coating film. It is particularly suitable for use in automobile parts such as piston ring.

Example

Then, the present invention is more specifically described according to an example.

1. Manufacturing of a Friction-Wear Test Sample (1) Forming of a Substrate and an Intermediate Layer A substrate (in line with a material of SWOSC-V) was prepared, to form a piston ring shape with a diameter (φ) of 80 mm, a ring radial-direction width (a1) of 2.6 mm, a ring axial-direction width (h1) of 1.2 mm, grinding was carried out after a CrN layer having a thickness of 10 μm coated the surface of the sliding plane using an arc PVD device, and a CrN layer coated steel substrate having surface roughness Rz of 0.3 μm was prepared.

(2) Forming of a Coating Film

Figure 4:
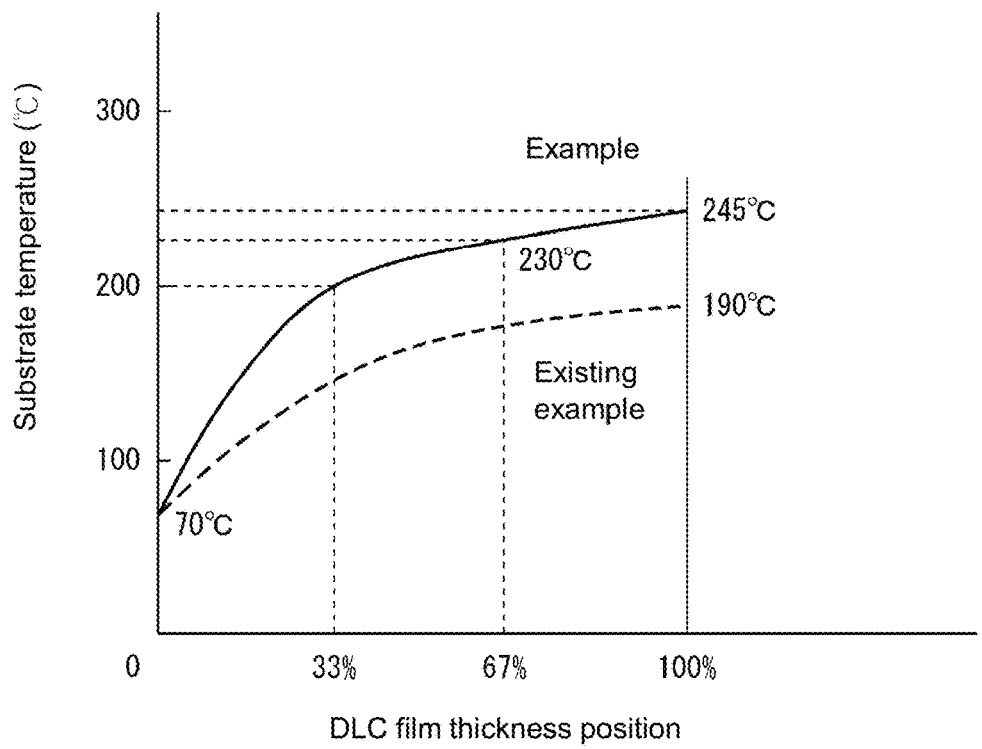
FIG. 4 is a diagram that conceptually indicates changes of the substrate temperature when the coating film is formed according to an example of the present invention and the existing example.

Next, an arc PVD device including a film-forming furnace 11 shown in FIG. 3 was used, a Cr intermediate layer having a thickness of 0.2 μm and a hard carbon film having a thickness of 0.9 μm were formed on the CrN layer coated steel substrate under a film-forming condition as shown below, and samples of the example and the existing example were made. FIG. 4 is a diagram that conceptually indicates changes of the substrate temperature when the coating film is formed according to the example and the existing example, in which the horizontal axis is the film-forming time, and the vertical axis is the substrate temperature.

(a) Example

After the CrN layer coated steel substrate was configured on the rotating and revolving fixture 14 as a substrate supporting device, it was disposed in the furnace 11 of the arc PVD device, a metal Cr layer having a coating thickness of 0.2 μm was used as the intermediate layer, the heater 13 was heated to 250° C., arc discharge was conducted at 6.8 kW (−170 V, 40 A), and the hard carbon begun to be coated with carbon cathode. At this point, the rotating and revolving fixture 14 was set to rotate at 39 rpm and revolve at 4 rpm. In addition, the arc current was controlled using a thermo-couple within a range of 40 A to 100 A in a manner of continuously raising the temperature of the substrate 21 in the furnace 11 from 70° C. at the beginning of the film-forming to the highest temperature 245° C. at the later stage of the film-forming.

(b) Existing Example

The bias voltage in the hard carbon film-forming was set as −75 V, and film-forming was conducted similarly as the example. The substrate temperature in the film-forming continuously rose from 70° C. to 190° C.

Surfaces of the samples obtained were ground once again, and after the surface roughness Rz was adjusted to 0.15 μm, the following evaluation was made.

2. Evaluation of the Coating Film (1) Observation of a Bright-Field TEM Image

A bright-field TEM image of the coating film formed was observed. Observation results were shown in Table 1.

TABLE 1

| | TEM structure observed |
|---|---|
| Example | Substrate side (lower layer): a dark hard carbon layer having a thickness of 0.6 μm<br>Surface side (upper layer): a mesh-shaped hard carbon layer having thickness of 0.3 μm |

TABLE 1-continued

| | TEM structure observed |
|---|---|
| Existing example | a dark hard carbon layer having a thickness of 0.9 μm |

As shown in Table 1, it is confirmed that, in the example, a mesh-shaped hard carbon layer is formed on the dark hard carbon layer, then the mesh-shaped hard carbon layer is formed in a manner that white-colored hard carbon is in a mesh shape extending in the thickness direction and black-colored hard carbon is dispersed into the cavities in the mesh. In addition, it is confirmed that the line width of the mesh of the white-colored hard carbon is 0.5 nm to 10 nm, and mainly 1 nm to 5 nm.

The reason for forming such a mesh-shaped hard carbon layer is as follows: under a bias voltage of −170 V, as shown in FIG. 4, when the coating temperature of the substrate is below 200° C., a lower layer is formed first at the beginning of the film-forming, and under a condition of a temperature controlled to be above 230° C. (which is 225° C. to 245° C. in the example), an upper layer is formed.

In addition, it is confirmed that, under a condition of a temperature controlled to be 210° C. to 245° C., 220° C. to 245° C., above 200° C. and below 295° C., above 200° C. and below 250° C., 210° C. to 250° C. below, 220° C. to 275° C., 230° C. to 260° C. and so on, an upper layer is formed by adjusting the bias voltage and the like.

On the other hand, it is confirmed that, in the existing example, the mesh-shaped hard carbon layer is not formed, but only a dark hard carbon layer is formed.

(2) Measurement of Resistance, ID/IG Ratio, Electron Beam Diffraction, Hydrogen Content, Nano Indentation Hardness and the Sp$^2$/Sp$^3$ Ratio The resistance of the upper layer (mesh-shaped hard carbon layer), the ID/IG ratio, amorphism obtained from electron beam diffraction, hydrogen content, nano indentation hardness, and the sp$^2$/sp$^3$ ratio are measured for the coating film of the example. In addition, the measurement of the amorphism obtained from electron beam diffraction and the measurement of the sp$^2$/sp$^3$ ratio are conducted on both the white-colored hard carbon and the black-colored hard carbon. In addition, the nano indentation hardness and the sp$^2$/sp$^3$ ratio of the lower hard carbon layer are also measured. The measurements results are shown in Table 2.

TABLE 2

| | Example | | | |
|---|---|---|---|---|
| | Upper layer (mesh-shaped hard carbon layer) | | | |
| | White-colored hard carbon | Black-colored hard carbon | Lower layer | Existing example |
| Resistance (Ω · cm) | 20-200 | | | 10K-30K |
| ID/IG ratio | 2.3 | | 0.5 | 0.5 |
| Electron beam diffraction | Scattering pattern | Diffraction spot | Scattering pattern | Scattering pattern |
| Hydrogen content (atom %) | 0 | | 0 | 0 |
| Nano indentation hardness (GPa) | 25 | | 58 | 60 |
| sp$^2$/sp$^3$ ratio | 0.35-0.46 | 0.19-0.28 | 0.20-0.24 | 0.18-0.22 |

It is confirmed from Table 2 that, in the example, the resistance, the nano indentation hardness, and the ID/IG ratio of the upper layer (mesh-shaped hard carbon layer), electron beam diffraction and the sp$^2$/sp$^3$ ratio of the white-colored hard carbon and the black-colored hard carbon, the nano indentation hardness and the sp$^2$/sp$^3$ ratio of the lower layer meet the requirements of the main technical solutions of the present invention respectively.

(3) Friction-Wear Test

Figure 5:
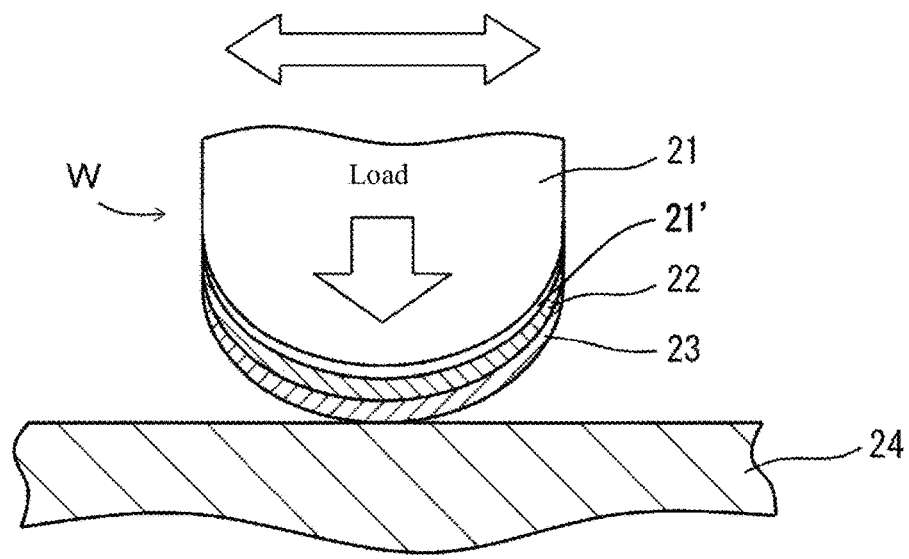
FIG. 5 is a diagram that schematically indicates a friction-wear testing method.

Then, a friction-wear test using a SRV (Schwingungs Reihungund und Verschleiss) tester generally conducted in the evaluation of automobile sliding members is conducted on the coating film. Specifically, as shown in FIG. 5, in a state that a sliding surface of a friction-wear test sample W abuts against a SUJ2 material 24 as a sliding object, loads of 100 N and 1000 N are applied to make it slide back and forth, and the sliding surface of the friction-wear test sample W is observed using a microscope. In addition, in FIG. 5, 22 is an intermediate layer, and 23 is a coating film. In addition, 21' is CrN.

Figure 6:
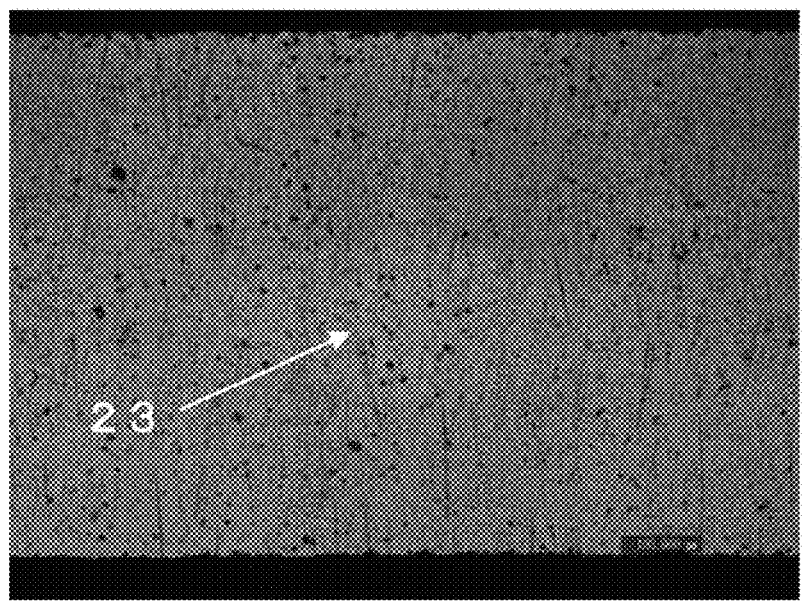
FIG. 6 is a microscope photo that indicates a friction-wear testing result according to an example of the present invention.
Figure 7:
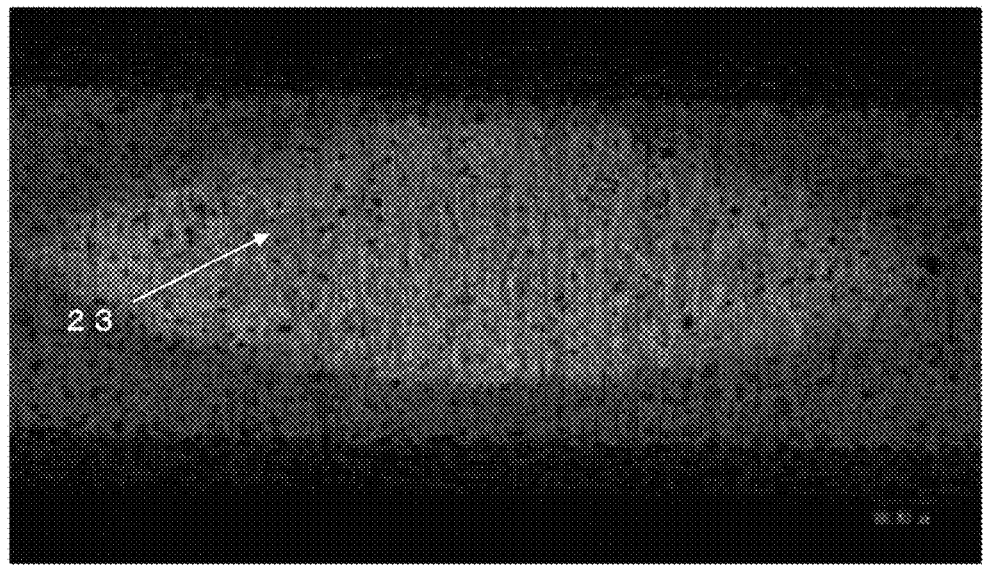
FIG. 7 is a microscope photo that indicates a friction-wear testing result according to an example of the present invention.
Figure 8:
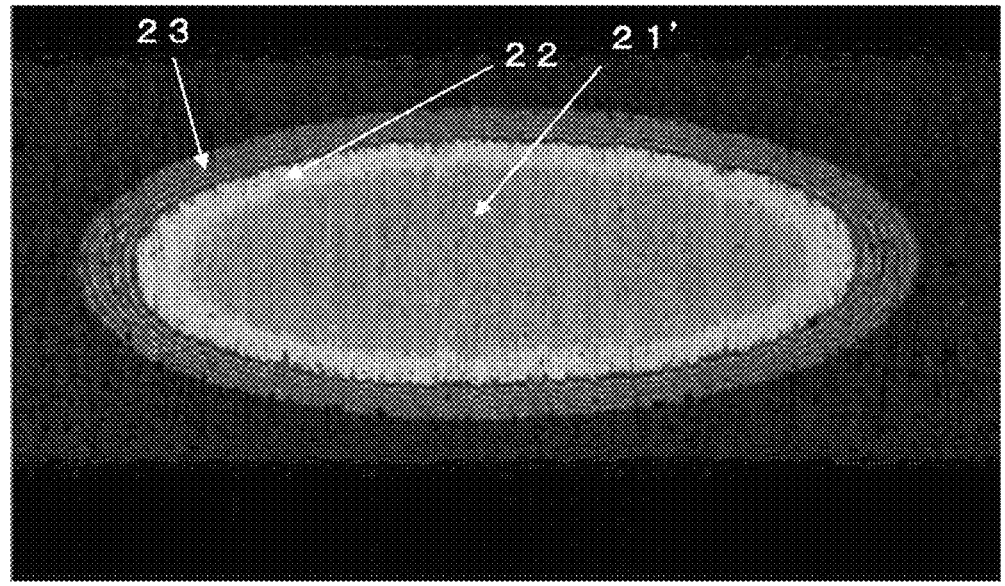
FIG. 8 is a microscope photo that indicates a friction-wear testing result according to the existing example.
Figure 9:
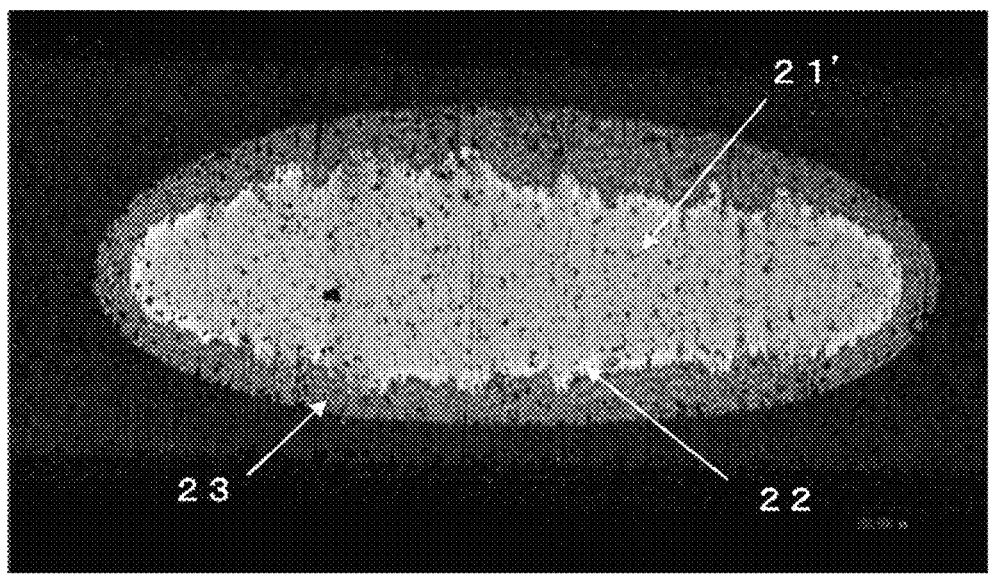
FIG. 9 is a microscope photo that indicates a friction-wear testing result according to the existing example.

An example of the testing result is shown in FIG. 6 to FIG. 9. FIG. 6 is a microscope photo of a sliding surface after 10-minute sliding with a load of 100 N according to the example, and FIG. 7 is a microscope photo of a sliding surface after 1-hour sliding with a load of 1000 N according to the example. In addition, FIG. 8 is a microscope photo of a sliding test result after 10-minute sliding with a load of 100 N according to the existing example, and FIG. 9 is a microscope photo of a sliding surface after 1-hour sliding with a load of 1000 N according to the existing example. In addition, the light gray portion 23 of FIG. 6 and FIG. 7 is a hard carbon coating film, the central light gray portion 21' in FIG. 8 and FIG. 9 is CrN, and a nearly-white gray portion 22 therearound is an intermediate layer of Cr. A dark gray portion 23 therearound is a hard carbon coating film.

As shown in FIG. 7, it can be confirmed that, in the example, even if the coating film slides for 1 hour with the load of 1000 N, peeling of the hard carbon does not occur, and wear is stopped in the black-colored hard carbon coating film; the coating film of the example may not chip or peel even if used with a high load for a long time, and thus has excellent performance as a coating film.

On the other hand, it can be confirmed that, as shown in FIG. 8, in the existing example, at the time of sliding for 10 minutes with the load of 100 N, the hard carbon coating film rubs away due to chipping or peeling, and the CrN layer of the CrN layer coated steel substrate is exposed. Then, it can be confirmed that, as shown in FIG. 9, in the existing example, if the coating film slides for 1 hour with the load of 1000 N, similar to the load of 100 N, the hard carbon coating film rubs away due to chipping or peeling, and the CrN layer of the CrN layer coated steel substrate is exposed.

The above describes the present invention according to implementation forms, but the present invention is not limited to the implementation forms. Various changes can be made to the implementation forms within the same and equivalent scopes of the present invention.

DESCRIPTION ABOUT NUMERALS 1, 23: coating film
1a: mesh-shaped hard carbon layer
1b: lower layer
2, 21: substrate
11: furnace
12: vacuum chamber
13: heater 14: rotating and revolving fixture (substrate supporting device)
15: thermocouple
21': CrN
22: intermediate layer
24: SUJ2 material
T: target
W: friction-wear test sample

What is claimed is:

1. A coating film, coated on a substrate surface, wherein
the coating film has a hard carbon that presents relatively black and white when observed in a cross-sectional bright-field TEM image,
a mesh-shaped hard carbon layer is formed using a PVD method, wherein the mesh-shaped hard carbon layer is that white-colored hard carbon in a mesh shape extending in the thickness direction and black-colored hard carbon dispersed into the cavities in the mesh,
the ID/IG ratio is 1-6 when the mesh-shaped hard carbon layer is measured using Raman spectroscopy, said ratio being the ratio of the Raman spectrum D band peak area intensity and G band peak area intensity, wherein
the white-colored hard carbon in a mesh shape extending in the thickness direction displays an amorphous scattering pattern in electron beam diffraction,
the mesh-shaped hard carbon layer further has a lower non-mesh-shaped hard carbon layer,
the lower hard carbon layer displays a color darker than the white-colored hard carbon in a mesh shape extending in the thickness direction in the bright-field TEM image,
the mesh-shaped hard carbon layer grows to be fan-shaped from the lower hard carbon layer, and
the fan-shaped growing starts with the white-colored hard carbon.

2. The coating film according to claim 1, wherein the white-colored hard carbon in a mesh shape extending in the thickness direction has a width of 0.5 nm to 10 nm.

3. The coating film according to claim 1, wherein at least one part of the black-colored hard carbon dispersed into the cavities in the mesh displays a diffraction spot in a position at lattice spacing of 0.3 nm to 0.4 nm in electron beam diffraction.

4. The coating film according to claim 1, wherein the hydrogen content of the mesh-shaped hard carbon layer is below 10 atom %.

5. The coating film according to claim 1, wherein the nano indentation hardness of the mesh-shaped hard carbon layer is 10 GPa to 35 GPa.

6. The coating film according to claim 1, wherein the $sp^2/sp^3$ ratio of the white-colored hard carbon in a mesh shape extending in the thickness direction is 0.2 to 0.9.

7. The coating film according to claim 1, wherein the $sp^2/sp^3$ ratio of the black-colored hard carbon dispersed into the cavities in the mesh is 0.15 to 0.7.

8. The coating film according to claim 1, wherein the $sp^2/sp^3$ ratio is 0.1 to 0.3.

9. The coating film according to claim 8, wherein the nano indentation hardness of the lower hard carbon layer is 35 GPa to 80 GPa.

10. A manufacturing method for a coating film, using an arc PVD method,
controlling the bias voltage, arc current, heater temperature and/or furnace pressure in a manner of maintaining a substrate temperature exceeding 200° C. and below 300° C., and
coating the substrate surface with the hard carbon film while rotating and/or revolving the substrate,
thus manufacturing the coating film according to claim 1.

11. A PVD device, for manufacturing method for a coating film according to claim 10, wherein
the PVD device is an arc PVD device having a control mechanism that controls a substrate temperature exceeding 200° C. and below 300° C.

12. The PVD device according to claim 11, comprising:
a substrate supporting mechanism that supports the substrate to rotate and revolve freely; and
a rotary control mechanism that controls the speed of rotation and/or revolution of the substrate.

13. A coating film, coated on a substrate surface, wherein
a mesh-shaped hard carbon layer is formed using a PVD method, wherein the mesh-shaped hard carbon layer has two kinds of hard carbon with different $sp^2/sp^3$ ratios, the first kind of hard carbon with a higher $sp^2/sp^3$ ratio is in a mesh shape extending in the thickness direction, and the second kind of hard carbon with a lower $sp^2/sp^3$ ratio is dispersed into the cavities in the mesh,
the ID/IG ratio is 1-6 when the mesh-shaped hard carbon layer is measured using Raman spectroscopy, said ratio being the ratio of the Raman spectrum D band peak area intensity and G band peak area intensity, wherein
the white-colored hard carbon in a mesh shape extending in the thickness direction displays an amorphous scattering pattern in electron beam diffraction,
the mesh-shaped hard carbon layer further has a lower non-mesh-shaped hard carbon layer,
the lower hard carbon layer displays a color darker than the white-colored hard carbon in a mesh shape extending in the thickness direction in the bright-field TEM image,
the mesh-shaped hard carbon layer grows to be fan-shaped from the lower hard carbon layer, and
the fan-shaped growing starts with the white-colored hard carbon.

14. A coating film, coated on a substrate surface, wherein
a mesh-shaped hard carbon layer is formed using a PVD method, wherein the mesh-shaped hard carbon layer has a white and black contrast in a cross-sectional bright-field TEM image, white-colored hard carbon is in a mesh shape extending in the thickness direction by starting to branch from a white point, and black-colored hard carbon is dispersed into the cavities thereof,
the ID/IG ratio is 1-6 when the mesh-shaped hard carbon layer is measured using Raman spectroscopy, said ratio being the ratio of the Raman spectrum D band peak area intensity and G band peak area intensity, wherein
the white-colored hard carbon in a mesh shape extending in the thickness direction displays an amorphous scattering pattern in electron beam diffraction,
the mesh-shaped hard carbon layer further has a lower non-mesh-shaped hard carbon layer,
the lower hard carbon layer displays a color darker than the white-colored hard carbon in a mesh shape extending in the thickness direction in the bright-field TEM image,
the mesh-shaped hard carbon layer grows to be fan-shaped from the lower hard carbon layer, and
the fan-shaped growing starts with the white-colored hard carbon.

15. A coating film, coated on a substrate surface, wherein
a mesh-shaped hard carbon layer is formed using a PVD method, wherein the mesh-shaped hard carbon layer has two kinds of hard carbon with different $sp^2/sp^3$ ratios, the first kind of hard carbon with a higher $sp^2/sp^3$ ratio is in a mesh shape extending in the thickness direction by starting to branch from a point with a higher $sp^2/sp^3$ ratio, and the second kind of hard carbon with a lower $sp^2/sp^3$ ratio is dispersed into the cavities thereof, the ID/IG ratio is 1-6 when the mesh-shaped hard carbon layer is measured using Raman spectroscopy, said ratio being the ratio of the Raman spectrum D band peak area intensity and G band peak area intensity, wherein the white-colored hard carbon in a mesh shape extending in the thickness direction displays an amorphous scattering pattern in electron beam diffraction, the mesh-shaped hard carbon layer further has a lower non-mesh-shaped hard carbon layer, the lower hard carbon layer displays a color darker than the white-colored hard carbon in a mesh shape extending in the thickness direction in the bright-field TEM image, the mesh-shaped hard carbon layer grows to be fan-shaped from the lower hard carbon layer, and the fan-shaped growing starts with the white-colored hard carbon.

16. A coating film, coated on a substrate surface, wherein a mesh-shaped hard carbon layer is formed using a PVD method, wherein the mesh-shaped hard carbon layer has a white and black contrast in a cross-sectional bright-field TEM image, white-colored hard carbon is in a mesh shape extending in the thickness direction by branching, and black-colored hard carbon is dispersed into the cavities thereof, the ID/IG ratio is 1-6 when the mesh-shaped hard carbon layer is measured using Raman spectroscopy, said ratio being the ratio of the Raman spectrum D band peak area intensity and G band peak area intensity, wherein the white-colored hard carbon in a mesh shape extending in the thickness direction displays an amorphous scattering pattern in electron beam diffraction, the mesh-shaped hard carbon layer further has a lower non-mesh-shaped hard carbon layer, the lower hard carbon layer displays a color darker than the white-colored hard carbon in a mesh shape extending in the thickness direction in the bright-field TEM image, the mesh-shaped hard carbon layer grows to be fan-shaped from the lower hard carbon layer, and the fan-shaped growing starts with the white-colored hard carbon.

17. A coating film, coated on a substrate surface, wherein a mesh-shaped hard carbon layer is formed using a PVD method, wherein the mesh-shaped hard carbon layer has two kinds of hard carbon with different $sp^2/sp^3$ ratios, the first kind of hard carbon with a higher $sp^2/sp^3$ ratio is in a mesh shape extending in the thickness direction by branching, and the second kind of hard carbon with a lower $sp^2/sp^3$ ratio is dispersed into the cavities thereof, the ID/IG ratio is 1-6 when the mesh-shaped hard carbon layer is measured using Raman spectroscopy, said ratio being the ratio of the Raman spectrum D band peak area intensity and G band peak area intensity, wherein the white-colored hard carbon in a mesh shape extending in the thickness direction displays an amorphous scattering pattern in electron beam diffraction, the mesh-shaped hard carbon layer further has a lower non-mesh-shaped hard carbon layer, the lower hard carbon layer displays a color darker than the white-colored hard carbon in a mesh shape extending in the thickness direction in the bright-field TEM image, the mesh-shaped hard carbon layer grows to be fan-shaped from the lower hard carbon layer, and the fan-shaped growing starts with the white-colored hard carbon.

\* \* \* \* \*